US008261011B2

(12) United States Patent  
Strauss et al.

(10) Patent No.: US 8,261,011 B2
(45) Date of Patent: Sep. 4, 2012

(54) ONE-TIME PROGRAMMABLE MEMORY DEVICE AND METHODS THEREOF

(75) Inventors: Timothy J. Strauss, Austin, TX (US); Kelly K. Taylor, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 334 days.

(21) Appl. No.: 12/608,548

(22) Filed: Oct. 29, 2009

(65) Prior Publication Data

US 2011/0107010 A1   May 5, 2011

(51) Int. Cl.
    *G06F 12/00* (2006.01)
(52) U.S. Cl. .................................. 711/103; 365/185.03
(58) Field of Classification Search .................. 711/103; 365/185.03
    See application file for complete search history.

(56) References Cited

U.S. PATENT DOCUMENTS

| 5,390,317 | A | 2/1995 | Weiss et al. |
| 5,890,191 | A | 3/1999 | Espinor et al. |
| 7,130,209 | B2 | 10/2006 | Reggiori et al. |
| 7,180,764 | B2 | 2/2007 | Kim et al. |
| 7,290,115 | B2 | 10/2007 | Hill et al. |
| 7,388,250 | B2 | 6/2008 | Chen et al. |
| 7,394,689 | B2 | 7/2008 | Ryu |
| 7,398,554 | B1 | 7/2008 | Falik et al. |
| 7,466,600 | B2 | 12/2008 | Roohparvar |
| 7,532,517 | B2 | 5/2009 | Louie et al. |
| 7,864,593 | B2 * | 1/2011 | Taeuber et al. .......... 365/185.24 |
| 2005/0013162 | A1 | 1/2005 | Jeon et al. |
| 2005/0105331 | A1 | 5/2005 | Lee et al. |
| 2007/0133629 | A1 | 6/2007 | Hu et al. |
| 2008/0023790 | A1 | 1/2008 | Scheuerlein |
| 2008/0025076 | A1 * | 1/2008 | Scheuerlein et al. ......... 365/163 |
| 2009/0049364 | A1 * | 2/2009 | Jo et al. ........................ 714/763 |

OTHER PUBLICATIONS

PCT/US2010/053205 International Search Report and Written Opinion mailed Jun. 21, 2011.

* cited by examiner

*Primary Examiner* — Hashem Farrokh

(57) ABSTRACT

A portion of a programmable memory device is configured as a one-time programmable (OTP) memory, where in response to a write access to the memory device, a memory controller determines whether the write access is associated with a memory location designated as an OTP memory location. If so, the memory controller performs a read of the memory location, and allows the write access only if each memory cell of the memory location is in an un-programmed state. Thus, only a single write access to an OTP memory location is permitted, and subsequent write attempts are disallowed. Further, to enhance detection of programmed cells, the read of the OTP memory location is performed with a lower read voltage than a read voltage associated with a write access to a non-OTP memory location, thereby improving detection of programmed memory cells in the OTP memory location.

20 Claims, 6 Drawing Sheets

US 8,261,011 B2

ONE-TIME PROGRAMMABLE MEMORY DEVICE AND METHODS THEREOF

FIELD OF THE DISCLOSURE

The present disclosure relates generally to electronic devices including memory and more particularly to electronic devices including programmable memory devices.

BACKGROUND

Data processing devices sometimes employ one-time programmable (OTP) memory elements to store information that is assumed to be unlikely to change, such as trimming information, security information, product identifier information, and the like. An example of an OTP memory element is a programmable fuse that can be blown via an electrical charge or application of a laser. However, such fuses can be expensive and the programming process of the fuses can be difficult.

DETAILED DESCRIPTION

FIGS. 1-6 illustrate example techniques for employing a programmable memory device as an OTP memory, where in response to a write access to the programmable memory device, a memory controller determines whether the write access is associated with a memory location designated as an OTP memory location. If so, the memory controller performs a read of the memory location, and allows the write access only if each memory cell of the memory location is in an un-programmed state. Thus, only a single write access to an OTP memory location is permitted, and subsequent write attempts are disallowed. Further, to enhance detection of programmed cells, the read of the OTP memory location is performed with a lower read voltage than a read voltage associated with a write access to a non-OTP memory location, thereby improving detection of programmed memory cells in the OTP memory location.

Figure 1:
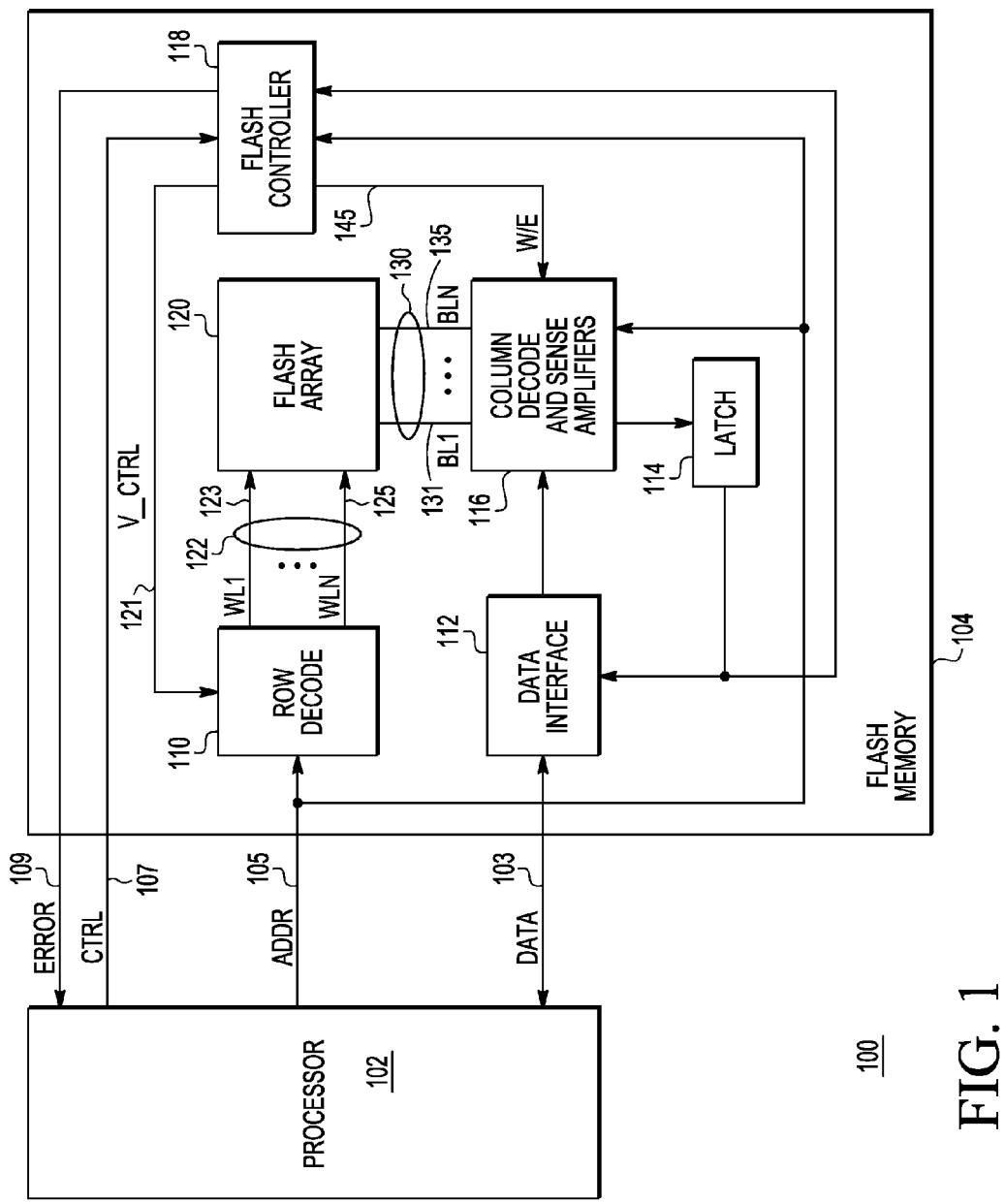
FIG. 1 is a block diagram of a data processing device in accordance with one embodiment of the present disclosure.

FIG. 1 illustrates a block diagram of a data processing device 100 in accordance with one embodiment of the present disclosure. The data processing device 100 includes a processor 102 and a flash memory 104. The processor 102 can be a general purpose or application specific processor operable to execute sets of instructions, thereby performing assigned tasks. In conjunction with executing the sets of instructions, the processor 102 can transfer data information to and from the flash memory 104. To transfer data information, the processor 102 provides signaling to the flash memory 104 via one or more busses, including data signaling 103 via bus DATA, address signaling 105 via bus ADDR, and control signaling 107 via bus CTRL. Responsive to the signaling provided by processor 102, the flash memory 104 provides error information via error signaling 109 via bus ERROR, and data information via data signaling 103.

The processor 102 is operable to transfer data information via memory accesses, where a transfer of data information from the processor 102 is referred to as a write access, and a transfer of data information to the processor 102 is referred to as a read access. To illustrate, to perform a write access, the processor 102 communicates the data information to be stored via data signaling 103 and communicates, via address signaling 105, address information indicative of the memory location at which the data information is to be stored. In an embodiment, the processor 102 also provides control information via control signaling 107 to indicate the write access. In response the flash memory 104 will store the information provided via the data signaling 103. To perform a read access, the processor 102 provides, via address signaling 105, address information corresponding to the memory location from which the data is to be retrieved, and provides control information via control signaling 107 to indicate the read access. In response, the flash memory 104 will provide the information being read at bus DATA.

As described in more detail below, the flash memory 104 includes a number of memory locations capable of storing data information. In an embodiment, each memory location includes one or more memory cells, where each memory cell stores a single bit of data information. Each memory cell is configured to be set to one of two digital states, corresponding to a logic value of "1" and "0" respectively. As described further below, each memory cell of the flash memory 104 can be set to one of the two digital states via an operation referred to as a programming operation. Cells which have undergone a programming operation are referred to as being in a programmed state, which cells that have not been programmed are referred to as being in an un-programmed state, or an erased state. Thus, programmed memory cells store information corresponding to a first of the two logic states, while un-programmed memory cells store information corresponding to the other of the two logic states. For example, in one embodiment each programmed memory cell stores a logic value of "1" while each un-programmed cell stores a logic value of "0." Flash memory 104 is configured so that the programmed or un-programmed state of a particular cell persists even when data processing device 100 is in a non-powered state.

Flash memory 104 is further configured to store data information at or retrieve data information from its memory locations in response to write accesses and read accesses, respectively. To illustrate, read and write accesses are indicated to flash memory 104 via control signaling 107. Each read or write access is also accompanied by address information, provided by address signaling 105, indicating the memory location associated with the access. Each write access is further accompanied by the data information to be stored. Responsive to a write access, the flash memory 104 stores the data information received via data signaling 103 at a memory location indicated by the address information. In response to a read access, the flash memory 104 retrieves data information from the memory location indicated by the received address information, and communicates the data information via data signaling 103. As described further below, flash memory 104 is further operable to determine that a write access or read access cannot be performed as requested, and in response provide an error message via error signaling 109.

In the illustrated embodiment, flash memory 104 includes a row decode module 110, a data interface 112, a latch 114, a column decode and sense amplifiers module 116, a flash controller 118, and a flash array 120. Row decode module includes an input to receive address signaling 105, an input to receive voltage control signaling 121, and outputs connected to a plurality of word lines 122, including word line 123 through an Nth word line 125.

Data interface 112 includes a first input to receive data signaling 103, a second input, and an output. Latch 114 includes an input and an output connected to the second input of data interface 112. Column decode and sense amplifiers module 116 includes an input coupled to bus ADDR to receive address signaling 105, an output connected to the input of latch 114, an input connected to the output of data interface 112, an input to receive write/erase signaling 145, and input/output terminals connected to a corresponding plurality of bit lines 130, including bit line 131 through an Nth bit line 135. Flash controller 118 includes an input to receive control signaling 107, an input connected to the output of latch 114, an input to receive address signaling 105, an output to provide error signaling 109, an output to provide voltage control signaling 121, and an output to provide write/erase signaling 145. The flash array 120 includes a plurality of input terminals, each of the plurality connected to a corresponding one of the plurality of word lines 122.

The modules of flash memory 104 are configured to store and retrieve data from information at flash array 120 in response to write and read accesses, respectively. To illustrate, row decode module 110 is configured to decode received address information to select one or more of the plurality of word lines 122 by providing a voltage at each of the selected word lines. The voltages provided to various word lines are provided by voltage control signaling 121 based upon whether a read or write access is being performed, and in the case of a write access based upon whether a particular memory cell associated with a word line is being programmed.

Column decode and sense amplifiers module 116 is configured to determine implement one of a write operation, an erase operation, or a read operation is to be performed based upon write/erase signaling 145 control information from flash controller 118. In response to a write operation being performed, the column decode and sense amplifiers module 116 selects one or more of the plurality of bit lines 130 based on address information received via address signaling 105. In an embodiment, the column decode and sense amplifiers module 116 drives bit lines associated with memory cells that are to be programmed to a program state based upon the data signaling 103 and address signaling 105. For example, the column decode and sense amplifiers module 116 asserts a voltage at a defined level, referred to herein as a program voltage, via each bit line to be programmed and a different voltage state to each bit line to remain erased. In response to determining an erase operation is to be performed, the column decode and sense amplifiers module 116 drives bit lines associated with memory cells that are to be erased to an erase state based upon the address signaling 105. For example, the column decode and sense amplifiers module 116 asserts a voltage at a defined level, referred to herein as an erase voltage, via each of the selected bit lines.

In response to determining a read operation, the column decode and sense amplifiers module 116 selects one or more of the plurality of bit lines 130 based on address information received via address signaling 105. The column decode and sense amplifiers module 116 converts the current provided via each bit line to an associated voltage level, compares the voltage level for each of the selected bit lines to a reference voltage, and determines a state of each bit line based on the corresponding comparison. Based on the determined state of each bit line, the column decode and sense amplifiers module 116 determines data information and stores the determined data information at latch 114.

The data interface 112 is configured to provide an interface between data signaling 103, latch 114, and column decode and sense amplifiers module 116. In particular, responsive to determining data information has been stored at latch 114, data interface 112 communicates the data information via data signaling 103. Responsive to determining data information is received via data signaling 103, data interface 112 provides the received data information to column decode and sense amplifiers module 116.

Flash controller 118 is configured to control the operations of flash memory 104 based on control information received via control signaling 107. In particular, the flash controller 118 can effectuate a write operation in response to a write access, to store data information at flash memory 104, and a read operation in response to a read access, to retrieve the data information from the memory location corresponding to the address associated with the write access.

To illustrate, in response to determining the control signaling 107 indicates a read access, the flash controller 118 indicates a read operation via write/erase signaling 145, and provides voltage control information via voltage control signaling 121 to indicate a voltage, referred to as a read voltage, to be used to bias memory cells connected to a selected write line by row decode module 110. In an embodiment, the flash controller 118 can perform at least two types of read operations, referred to herein as a margin read and a normal read, each with a corresponding voltage communicated via voltage control signaling 121. Similarly, in response to determining the control signaling 107 indicates a write access, the flash controller indicates a write operation via write/erase signaling 145, and provides voltage control information via voltage control signaling 121 to indicate a voltage, referred to as a write voltage, corresponding to the write operation.

Figure 2:
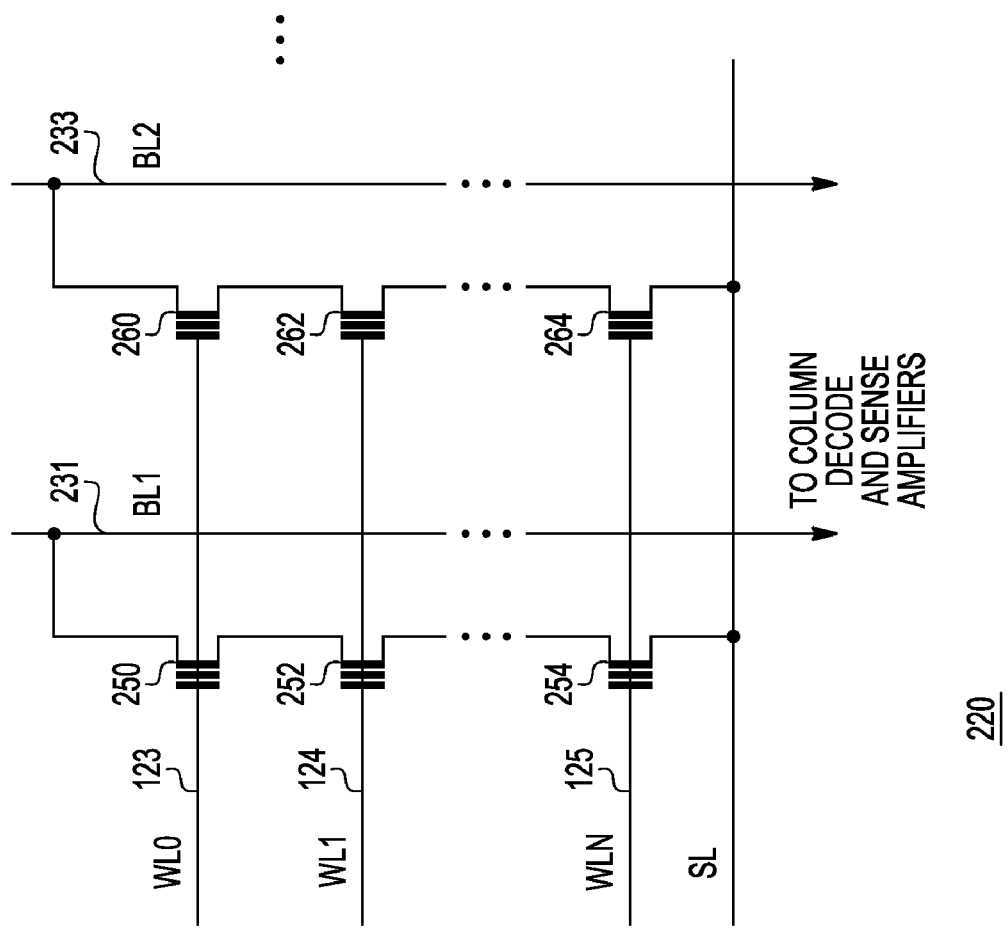
FIG. 2 is a circuit diagram of a particular embodiment of the flash array of FIG. 1.

Flash array 120 includes a plurality of memory cells configured to store or provide the data information at one or more of the plurality of memory cells based on voltages at each of the set of word lines 122 and each of the set of bit lines 130. Each memory cell is individually accessible for read and write operations based on application of voltages at the bit line and word line associated with the memory cell. This can be better understood with reference to FIG. 2. In particular, FIG. 2 illustrates flash array 220, corresponding to a particular embodiment of flash array 120. In the illustrated embodiment, flash array 220 includes a first column of floating gate transistors, including transistor 250, transistor 252, and transistor 254. Flash array 220 further includes a second column of floating gate transistors, including transistor 260, transistor 262, and transistor 264. It will be appreciated that flash array 220 can include additional columns of transistors, configured similarly to the illustrated columns, and that each column can include additional floating gate transistors, configured similarly to the illustrated transistors.

In the illustrated embodiment, transistor 250 includes a first current electrode connected to bit line 231, a second current electrode, and a control electrode connected to word line 123. Transistor 252 includes a first current electrode connected to the second current electrode of transistor 250, a second current electrode connected to a current electrode of another transistor (not shown) in the column, and a control electrode connected to word line 124. Transistor 254 includes a first current electrode connected to a current electrode of another transistor (not shown) in the column, a second current electrode connected to source line, and a control electrode connected to word line 125. In the illustrated embodiment, it is assumed that the source line is set to a nominal ground voltage for the data processing device 100.

Transistor 260 includes a first current electrode connected to bit line 233, a second current electrode, and a control electrode connected to word line 123. Transistor 262 includes a first current electrode connected to the second current electrode of transistor 260, a second current electrode connected to a current electrode of another transistor (not shown) in the column, and a control electrode connected to word line 124. Transistor 264 includes a first current electrode connected to a current electrode of another transistor (not shown) in the column, a second current electrode connected to source line, and a control electrode connected to word line 125.

For purposes of discussion, the transistors associated with a common word line are referred to as a row of transistors. Similarly, the transistors associated with a common bit line are referred to as a column of transistors. A memory location is associated with one or more transistors sharing a common row. Further, each transistor of the flash array 220 is configured as a single memory cell to store a single bit of information. To illustrate, each of the transistors 250-254 and 260-264 has an associated threshold voltage based on the number of electrons placed on the floating gate of the corresponding transistor. The number of electrons on the floating gate (and thus the threshold voltage) of a transistor can be changed by applying a voltage of sufficient magnitude, referred to herein as a program voltage, across the current electrodes of the transistor. In response to application of a voltage at the control electrode of a transistor, a current is drawn across the transistor's current electrodes. The amount of current drawn depends on the relationship between the voltage applied at the gate of the transistor and the threshold voltage of the transistor. Accordingly, assuming the voltage applied at the gate of a transistor (referred to generally as a read voltage) is within a defined range, information can be stored at the transistor by setting the corresponding threshold voltage relative to the read voltage range. This can be better understood with reference to FIG. 3, which illustrates a diagram 300 showing example threshold voltages for the flash array 220.

Figure 3:
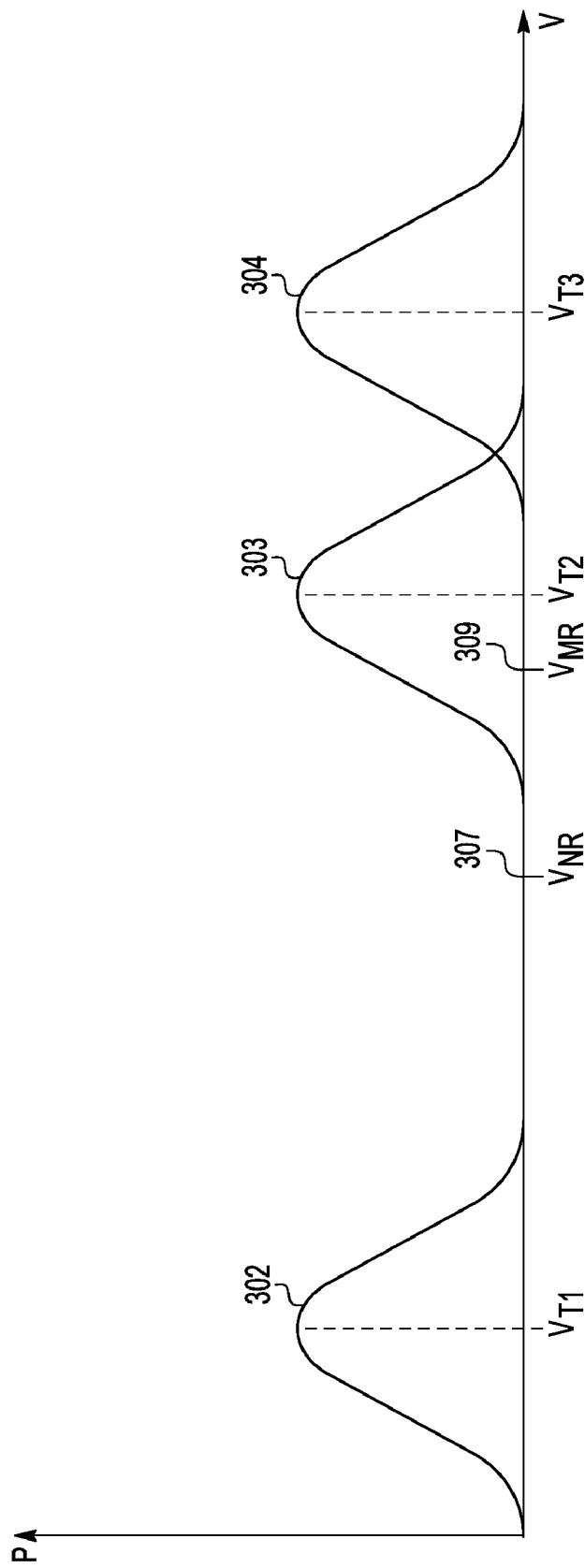
FIG. 3 is a graph illustrating example threshold voltages associated with the flash array of FIG. 2.

In particular, FIG. 3 illustrates threshold voltage ranges 302, 303, and 304. Threshold voltage range 302 represents the possible threshold voltage range of a transistor of flash array 220 prior to application of a program voltage at the transistor. Voltage range 304 represents the possible threshold voltage range of the transistor shortly after application of the program voltage. Further, voltage range 303 represents the possible threshold voltage range of the transistor a relatively large amount of time after application of the program voltage. Accordingly, in the illustrated embodiment, the threshold voltage range of the transistor decreases over time after a program operation. In addition, it will be appreciated that the y-axis of the diagram 300 indicates the relative probability that the threshold voltage is at the voltage indicated by the x-axis.

Diagram 300 further illustrates a voltage 307, referred to herein as a normal read voltage. This voltage represents the amount of voltage applied at the gate of a transistor during a normal read operation. In the illustrated embodiment, threshold voltage range 302 is below the normal read voltage. Thus, when the transistor 250 is in a non-programmed state, application of the normal read voltage will cause a relatively high amount of current to be conducted via the current electrodes of the transistor. Similarly, because threshold voltage ranges 303 and 304 are higher than the normal read voltage, transistor 250 will provide a relatively low amount of current in response to application of the read voltage at its control electrode when the transistor is in a programmed state. The information stored at transistor 250 can thus be set by setting the threshold voltage of the transistor.

To illustrate, referring again to FIG. 2, transistor 250 can be programmed and read based on voltages applied at the control and current electrodes of the transistor. In particular, to program transistor 250, column decode and sense amplifiers module 116 applies a specified voltage via bit line 231. Row decode module 110 applies a defined voltage to word line 123 and another defined voltage via each of the other word lines of the column, such that a program voltage is applied across the current electrodes of transistor 250. In response, the threshold voltage of transistor 250 is set within threshold voltage range 304 (FIG. 3).

To read information stored at transistor 250 based on a normal read operation, row decode module 110 applies a normal read voltage via word line 123, and applies a defined voltage, referred to as a pass through voltage to the other word lines of the column. Accordingly, a current will flow along the bit line 231, the amount of current based on the relationship between the normal read voltage and the threshold voltage of the transistor 250. Thus, if the transistor 250 is in an un-programmed state, a relatively large amount of current will be provided via bit line 231, while a relatively small amount of current will be provided if transistor 250 is in a programmed state. The column decode and sense amplifiers module 116 converts the provided current to a voltage, and compares the voltage to a threshold voltage to determine the state of the memory cell associated with transistor 250. In similar fashion, a margin read of transistor 250 can be performed by applying a margin read voltage, illustrated as voltage 309 (FIG. 3), to the control electrode of the transistor and comparing the resulting voltage the threshold voltage.

In an embodiment, the threshold voltage associated with a programmed cell can degrade over time. For example, in the illustrated example of FIG. 3, the threshold voltage of transistor 250 can be set within threshold voltage range 304 via a program operation. Over time, the threshold voltage may degrade so that it falls within threshold voltage range 303. As illustrated in FIG. 3, voltage range 304 includes voltages below the margin read voltage 309. Accordingly, a margin read of the memory cell associated with transistor 250 could erroneously result in the cell being identified as being in an un-programmed state. Thus, a normal read of a cell is more likely to give an accurate reading of the state of the cell.

Referring again to FIG. 1, the flash memory 104 can be configured so that one or more memory locations of the flash array 120 are configured as OTP memory. To illustrate, the flash controller 118 can determine whether received address information indicates a write access is associated with a defined or programmable range of memory addresses, referred to herein as an OTP region. If the write access is to the OTP region, the flash controller 118 performs a normal read on each of the memory locations of flash array 120 associated with the address information prior to attempting a write operation. The read operation results in data information stored at each of the memory locations being transferred to latch 114. The flash controller 118 determines, based on the data information at latch 114, whether any memory cell of the memory location is in a programmed state. If so, the flash controller 118 indicates via error signaling 109 that the write operation cannot be fulfilled, and does not attempt to write the data information associated with the write access to flash array 120. If none of the memory locations associated with the address information have been programmed, flash controller 118 fulfills the write operation. Thus, a memory location of the flash memory 104 operates as an OTP region that can be programmed only if none of the individual memory cells of the location have previously been programmed, thereby configuring the memory location as one time programmable.

If the flash controller 118 determines that a write access is associated with the non-OTP region of the flash array 120, the flash controller 118 performs a margin read, rather than a normal read, on each of the memory locations of flash array 120 associated with the address information to retrieve stored data information prior to attempting a write operation. The flash controller 118 determines, based on the read operation, whether any of the memory locations are programmed and, if so, whether the programmed locations correspond to memory locations designated to be programmed by the write access. If a memory cell designated to be programmed by the write access is indicated by the margin read as already in a programmed state, the flash controller 118 ensures that the memory cell is not re-programmed, thereby conserving power. Flash controller 118 further programs all un-programmed memory cells designated to be programmed by the write access.

It will be appreciated that the margin read operation may indicate some programmed memory cells to be un-programmed, as described previously. Such programmed memory locations, if designated to be programmed by the write access, will be re-programmed to have a higher threshold voltage above the margin read voltage. To illustrate, a memory location having a threshold voltage within threshold voltage range 303 (FIG. 3) may be indicated as being in an un-programmed state by the margin read operation. If the memory location is designated to be programmed by the write access, the memory cell will be programmed so that its threshold voltage will be set within threshold voltage range 304.

Figure 4:
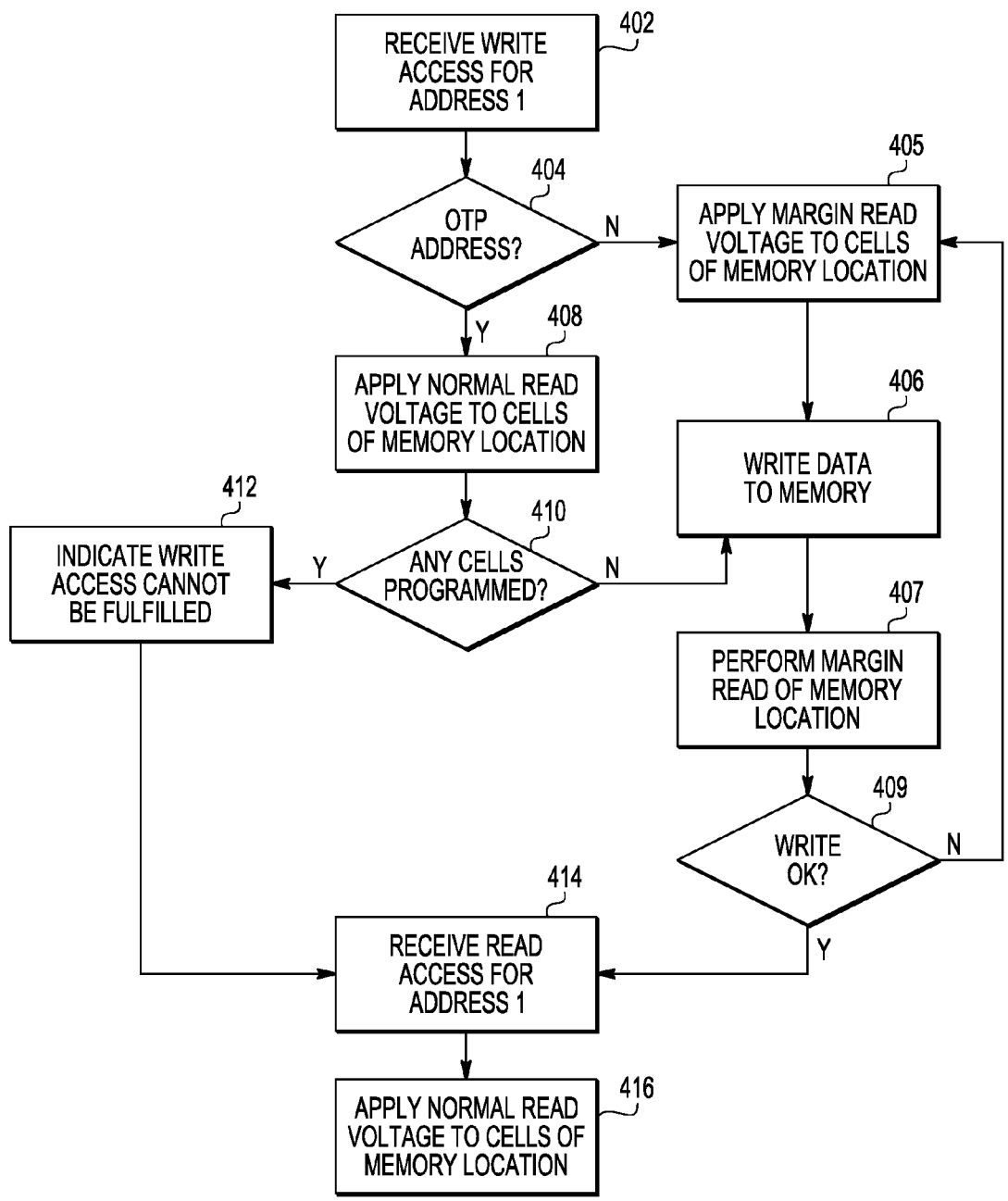
FIG. 4 is a flow diagram illustrating a method of performing a write access at the flash memory of FIG. 1 in accordance with one embodiment of the present disclosure.

The operation of data processing device 100 can be better understood with reference to FIG. 4, which illustrates a flow diagram of a particular embodiment of a method of performing a write access at the flash memory 104. At block 402, a write access associate with an address, designated Address 1, is received at flash memory 104. At block 404, the flash controller 118 determines whether Address 1 is associated with the OTP region of flash array 120. If not, the method flow proceeds to block 405 and the flash controller 118 performs a margin read operation to determine if any of the memory cells associated with Address 1 is in a programmed state. Margin reads are performed with respect to write accesses to the non-OTP region because, in the event that the threshold voltage of a programmed cell has degraded to below the margin read voltage, the programmed cell will subsequently be "reprogrammed" to set its voltage above the margin read voltage. This reduces the likelihood that the threshold voltage of the programmed cell will degrade to below the normal read voltage.

The method flow proceeds to block 406 and the flash controller 118 performs a write operation to write the un-programmed memory cells designated to be programmed as indicated by the data information associated with the write access. The method flow proceeds to block 407, where flash controller 118 performs a margin read of the memory location and compares the result with the data information associated with the write access. Based on the comparison, at block 409, the flash controller determines whether all cells of the memory location are in the state designated by the write access. If not, the method flow returns to block 406 and the flash controller 118 repeats the write operation. Once all of the memory cells of the memory location are in the state indicated by the write access, the method flow proceeds to block 414, described further below.

Returning to block 404, if flash controller 118 determines that Address 1 is associated with the OTP region, the method flow proceeds to block 408. At block 408, flash controller 118 communicates voltage control information to row decode module 110 to apply a normal read voltage to the word lines indicated by decoded address information associated with Address 1. Application of the normal read voltage causes a normal read of the memory location indicated by Address 1, thereby transferring the data information stored at that memory location to latch 114. At block 410, flash controller 118 determines based on the data information stored at latch 114 whether any of the memory cells associated with the memory location have been programmed. If not, the method flow proceeds to block 406 and the flash controller 118 performs a write operation to write received data information to the memory location.

Returning to block 410, if at least one of the memory cells of the memory location is in a programmed state, the method flow moves to block 412 and the flash controller 118 indicates via error signaling 109 that the write access cannot be fulfilled. The method flow proceeds to block 414 and flash memory 104 receives a read access for Address 1. In response, at block 416, flash controller 118 causes a normal read voltage to the memory cells of the memory location indicated by Address 1.

Figure 5:
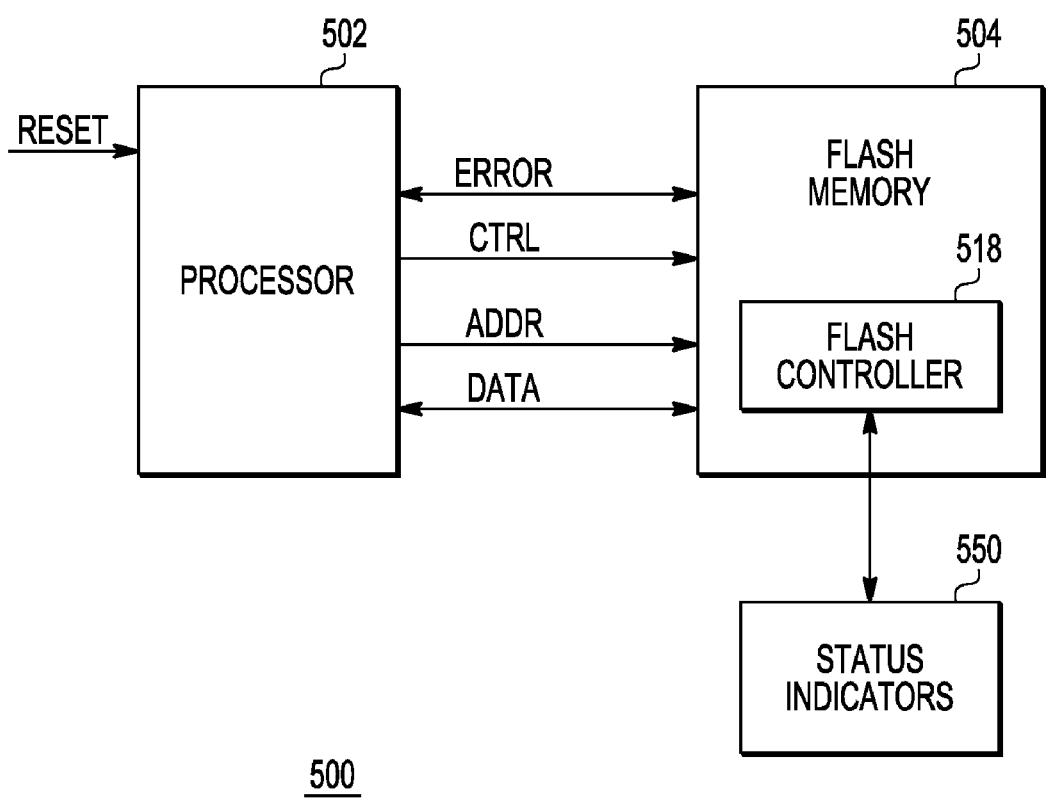
FIG. 5 is a block diagram of a data processing device in accordance with another embodiment of the present disclosure.

FIG. 5 illustrates a block diagram of a data processing device 500 in accordance with one embodiment of the present disclosure. Data processing device 500 includes a processor 502 and a flash memory 504, each configured similarly to the corresponding modules of the data processing device 100 of FIG. 1. In addition, data processing device 500 includes status indicators 550. Status indicators 550 include a set of storage elements that can store status information associated with the flash memory 504. Thus, status indicators 550 can be a memory, one or more registers, a set of latches, or any combination thereof.

Figure 6:
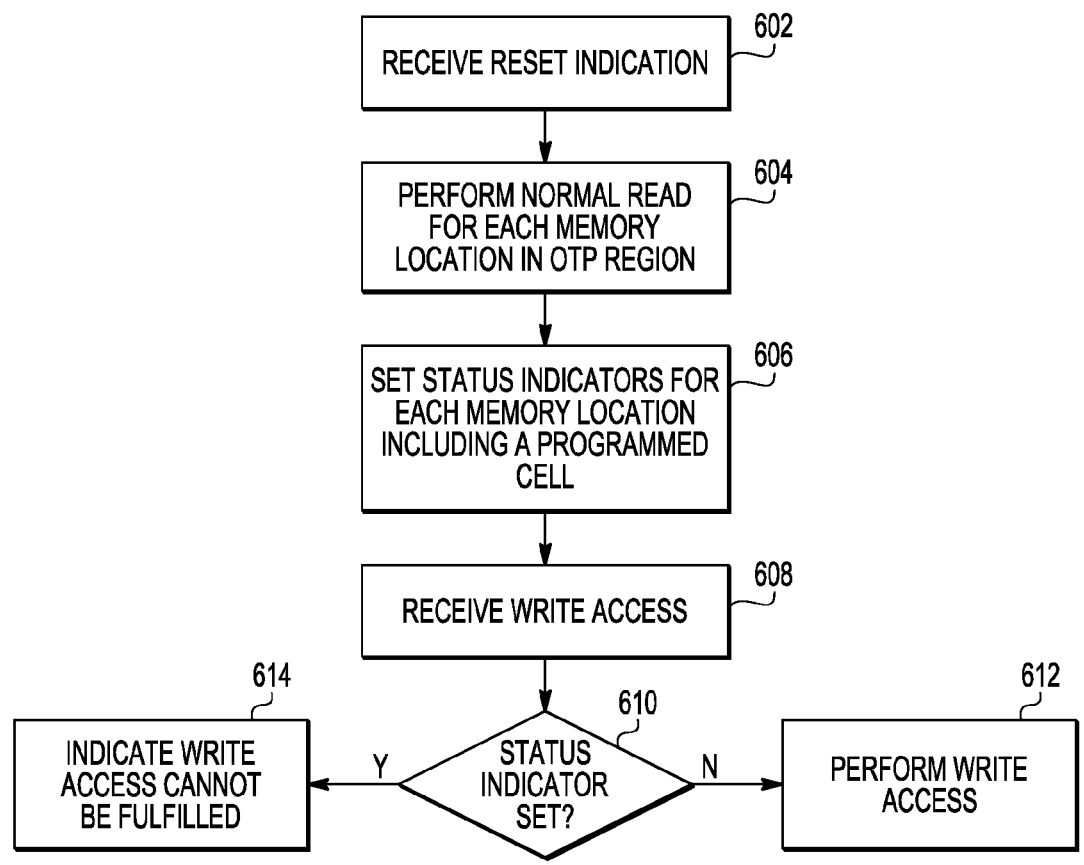
FIG. 6 is a flow diagram illustrating a method of performing a write access at the flash memory of FIG. 6 in accordance with one embodiment of the present disclosure.

The operation of data processing device 500 can be better understood with reference to FIG. 6, which illustrates a flow diagram of a method of performing a write access in accordance with one embodiment of the present disclosure. At block 602, the processor 502 receives a reset indication via signal RESET. In response, processor 502 provides control signaling to flash memory 504 to indicate a reset. At block 604, in response to the reset, flash controller 518 performs a normal read for each memory location in an OTP region of the flash array (not shown) of flash memory 504. Based on each margin read, the flash controller 518 determines whether a memory cell of each memory location is in a programmed state. At block 606, the flash controller sets a status indicator at status indicators 550 for each memory location in the OTP region that includes at least one programmed memory cell.

At block 608, during operation of the data processing device 500, the flash memory 504 determines that a write access for a designated address has been received. In response, at block 601, the flash controller 518 determines whether a status indicator for the memory location associated with the address has been set. If not, the method flow proceeds to block 612 and the flash controller 518 performs a write operation to write received data information to the memory location indicated by the address. If, at block 610, the flash controller 518 determines that a status indicator for the memory location has been set, the method flow moves to block 614 and the flash memory 504 indicates via error signaling that the write access cannot be fulfilled.

Thus, in the illustrated embodiment of FIGS. 5 and 6, the data processing device 500 determines the status of each memory location in the OTP region in response to each reset location, rather than in response to each write access to the OTP region. If the number of memory locations in the OTP region is relatively small, this can improve the overall efficiency of write accesses without substantially increasing the time to process a reset operation at data processing device 500.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

Other embodiments, uses, and advantages of the disclosure will be apparent to those skilled in the art from consideration of the specification and practice of the disclosure disclosed herein. For example, it will be appreciated that more than one transistor of the flash array 120 (FIG. 1) can be programmed simultaneously by applying the appropriate voltage along more than one of the set of bit lines 135. Further, more than one transistor of the flash array 120 can be read during a read operation by measuring the amount of current provided by each bit line, where each bit line indicates the state of the transistor in the associated column.

The specification and drawings should be considered exemplary only, and the scope of the disclosure is accordingly intended to be limited only by the following claims and equivalents thereof.

What is claimed is:

1. A method comprising:
receiving a first address indicative of a first memory location of a programmable memory, the first memory location comprising a plurality of memory cells;
in response to determining the first address is associated with a one-time programmable (OTP) memory location, applying a first read voltage to a first memory cell of the plurality of memory cells to determine a first state of the first memory cell; and
in response to determining the first address is not associated with the OTP memory location, applying a second read voltage to the first memory cell to determine the first state of the first memory cell, the second read voltage different from the first read voltage.

2. The method of claim 1, further comprising:
in response to determining the first address is associated with the OTP memory location and in response to determining the first state is indicative of an un-programmed state, applying a write voltage to the first memory cell to program the first memory cell.

3. The method of claim 2, wherein the first address is received in response to a first write request, and further comprising:
in response to determining the first address is associated with the OTP memory location and in response to determining the first state is indicative of a programmed state, not performing the first write request.

4. The method of claim 2, further comprising:
in response to applying the write voltage to the first memory cell, applying the second read voltage to the first memory cell to determine a second state of the first memory cell.

5. The method of claim 4, further comprising:
in response to determining the second state is indicative of an un-programmed state:
applying the write voltage to the first memory cell;
applying the second read voltage to the first memory cell to determine a third state of the first memory cell.

6. The method of claim 1, further comprising determining the first address whether the first address is associated with the OTP memory location based on whether the first address is in a first range of addresses.

7. The method of claim 1, further comprising:
in response to determining the first address is associated with the OTP memory location, setting a status indicator to a first state.

8. The method of claim 7, wherein receiving the first address comprises receiving the first address based on a first write access received at a first time, and further comprising:
receiving the first address based on a second write access received at a second time after the first time; and
in response to determining the first status indicator is in the second state, providing an indication that the second write access cannot be fulfilled.

9. The method of claim 1, wherein the programmable memory comprises a flash memory.

10. A method, comprising:
receiving at a first time a first address indicative of a first memory location of a flash memory, the first memory location comprising a plurality of memory cells;
in response to receiving the first address at the first time, applying a first read voltage to a first memory cell of the plurality of memory cells to determine a first state of the first memory cell;
in response to determining the first state is indicative of a programmed state setting a first status indicator to a first status;
receiving a write request associated with the first memory location at a second time after the first;
in response to receiving the write request:
determining a status of the first status indicator;
in response to determining the status of the first status indicator is a second status:
applying a write voltage to the first memory cell to program the first memory cell;
applying a second read voltage to the first memory cell to determine a second state of the memory cell, the second read voltage different from the first.

11. The method of claim 10, further comprising:
in response to determining the status of the first status indicator is the first status, not performing the write request.

12. The method of claim 10, further comprising:
in response to receiving the first address at the first time, applying the first read voltage to a second memory cell of the plurality of memory cells to determine a second state of the second memory cell;
in response to determining the second state is indicative of a programmed state setting the first status indicator to the first status.

13. The method of claim 10, further comprising in response to the write request:
in response to determining the first status indicator is a second status, setting the first status indicator to the first status.

14. The method of claim 10, wherein applying the first read voltage to the first memory cell comprises applying the first read voltage to the memory cell in response to determining the first address is associated with a first region of the flash memory.

15. A device, comprising:
a programmable memory array comprising a memory location comprising a plurality of memory cells;

a memory controller coupled to the flash memory array and comprising an input to receive a first address, the memory controller operable to:
- apply a first read voltage at each of the plurality of memory cells in response to receiving the first address at a first time to determine a corresponding state for each of the plurality of memory cells; and
- in response to determining each of the plurality of memory cells is in an un-programmed state:
  - apply a write voltage at a first memory cell of the plurality of memory cells; and
  - apply a second read voltage at the each of the plurality of memory cells, the second read voltage different from the first.

16. The device of claim 15, wherein the first address is associated with a first write access, and wherein the memory controller is operable to deny the first write access in response to determining that at least one of the plurality of memory cells is in a programmed state.

17. The device of claim 15, wherein the memory controller is operable to apply the first read voltage in response to determining the first memory location is associated with a one-time programmable (OTP) memory location, and is further operable to:
- in response to determining the first memory location is not associated with an OTP memory location, apply the second read voltage at each of the plurality of memory cells.

18. The device of claim 15, further comprising:
a first status indicator coupled to the memory controller, the memory controller configured to set the first status indicator to a first status in response to receiving the first address at the first time.

19. The device of claim 18, wherein the memory controller is further operable to:
- in response to receiving the first address at a second time after the first time, provide an indication that a write access associated with the first address cannot be fulfilled.

20. The device of claim 15, wherein the programmable memory array comprises a flash memory.

* * * * *